United States Patent
Shanjani et al.

(10) Patent No.: US 7,102,444 B2
(45) Date of Patent: Sep. 5, 2006

(54) METHOD AND APPARATUS FOR COMPENSATING AND IMPROVING EFFICIENCY IN A VARIABLE POWER AMPLIFIER

(75) Inventors: Payman Hosseinzadeh Shanjani, Palo Alto, CA (US); Hamid Reza Rategh, Stanford, CA (US)

(73) Assignee: ANADIGICS, Inc., Warren, NJ (US)

( * ) Notice: Subject to any disclaimer, the term of this patent is extended or adjusted under 35 U.S.C. 154(b) by 10 days.

(21) Appl. No.: 10/949,087

(22) Filed: Sep. 24, 2004

(65) Prior Publication Data

US 2005/0156671 A1    Jul. 21, 2005

Related U.S. Application Data

(63) Continuation-in-part of application No. 10/760,698, filed on Jan. 20, 2004.

(51) Int. Cl.
*H03F 3/68* (2006.01)
(52) U.S. Cl. .......................... 330/295; 330/302; 330/51
(58) Field of Classification Search ................ 330/295, 330/302, 306, 51
See application file for complete search history.

(56) References Cited

U.S. PATENT DOCUMENTS

| | | | | |
|---|---|---|---|---|
| 6,111,459 | A  * | 8/2000  | Nishijima et al. | 330/51 |
| 6,188,877 | B1 * | 2/2001  | Boesch et al. | 455/74 |
| 6,501,331 | B1 * | 12/2002 | Adar | 330/51 |
| 6,744,312 | B1 * | 6/2004  | White et al. | 330/51 |
| 6,806,767 | B1 * | 10/2004 | Dow | 330/51 |
| 6,954,623 | B1 * | 10/2005 | Chang et al. | 455/127.1 |

* cited by examiner

*Primary Examiner*—Patricia Nguyen
(74) *Attorney, Agent, or Firm*—H. Black P.E.

(57) ABSTRACT

A method and apparatus for an amplifier, such as a radio frequency amplifier embodiment as an integrated circuit is disclosed. Embodiments provide for operating with good energy efficiency at multiple power levels. Resonant components act to provide consistent operating parameters over the wide range of power levels used. A compensating impedance is switched into or out of circuit in high power mode to improve the match that would pertain without the compensation. Improved compensation and linearity may be provided using features disclosed. The invention may operate in the microwave region or at other RFs.

19 Claims, 5 Drawing Sheets

Figure 1 (Circuit from related application)

Figure 2 (Equivalent circuit from related application)

METHOD AND APPARATUS FOR COMPENSATING AND IMPROVING EFFICIENCY IN A VARIABLE POWER AMPLIFIER

RELATED APPLICATION

The present application is a continuation-in-part of co-pending U.S. patent application Ser. No. 10/760,698 filed Jan. 20, 2004 and which is incorporated herein by this reference. Inventor Rategh is common to both applications and both applications have the same assignee.

FIELD OF THE INVENTION

The invention generally relates to electronics circuits. The invention more particularly relates to amplifier circuits, for example, RF (radio frequency) PA (power amplifier) circuits especially integrated circuits for microwave signals that are used to provide gain of an input signal.

BACKGROUND OF THE INVENTION

Co-pending parent U.S. patent application Ser. No. 10/760,698 discloses a method and apparatus for an amplifier, such as a IC (integrated circuit) semiconductor amplifier for RF (radio frequency) signals, including high power RF in the microwave region.

The operating parameters of the designs of the parent application can be improved in various ways by exploiting the further refinements disclosed infra.

The disclosed improved amplifier designs are capable of multiple or variable power levels and superior tradeoffs between circuit performance and cost.

SUMMARY

Accordingly, the invention provides amplifiers with superior performance and power efficiency. Such an amplifier may be implemented as an IC (integrated circuit) with CMOS or other semiconductor technologies such as SiGe (Silicon Germanium), GaAs (Gallium Arsenide) or InP (Indium Phosphate) or other III–IV semiconductor devices. High operating frequency (e.g., microwave) may be supported through LSI (large scale integration), as is well-known in the art. Superior performance results from aspects of the novel designs.

According to a first aspect of the invention, a method for amplifying is disclosed, the method including operating two RF amplifiers each with matching network and summed outputs. In a first operating mode both amplifiers contribute materially to the summed output. In a second operating mode one of the amplifiers is cut off, or nearly so, and a compensating impedance is switched into the matching network. The compensating impedance may serve to change impedance seen at the output of the first amplifier and hence improve stage match and/or energy efficiency.

According to another aspect of the invention, an embodied circuit is disclosed which may exploit the method of the aspect.

According to a further aspect of the invention a circuit is disclosed that exploits cascaded amplifiers and a switchable compensating impedance.

Variants of these aspects are also disclosed together with alternative exemplary embodiments.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

Figure 1:
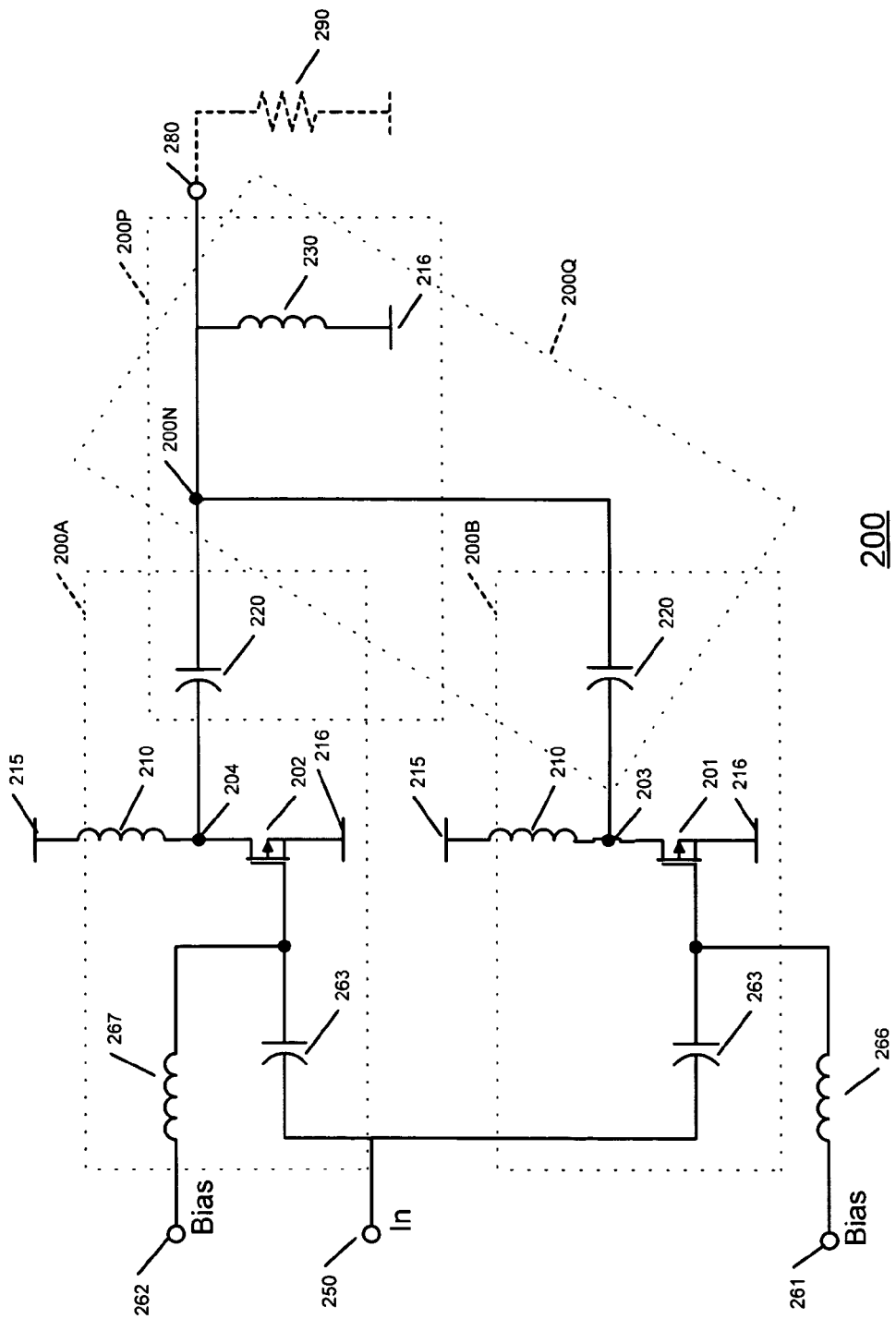
FIG. 1 shows a schematic diagram of a part of an integrated circuit according to an embodiment of the invention of the parent application.

In the following description, for purposes of clarity and conciseness of the description, not all of the numerous components shown in the schematics and/or drawings are described. The numerous components are shown in the drawings to provide a person of ordinary skill in the art a thorough, enabling disclosure of the present invention. The operation of many of the components would be understood and apparent to one skilled in the art.

FIG. 1 is a schematic diagram of a part of an integrated circuit 200 (IC) according to an embodiment of a RF amplifier disclosed in a related application. As shown, IC 200 implements an analog RF PA (power amplifier) circuit. As a power amplifier, IC 200 may produce relatively high power levels such as might typically be needed in connection with a transmitter driving a radiating antenna. IC 200 may be implemented or incorporated as part of a semiconductor chip using well-known technologies such as MOS (metal-oxide semiconductors). MOS technologies are commonly used to embody RF PAs for use with signals in the microwave region. NMOS transistors (n-channel metal-oxide semiconductor field-effect transistors) are shown in the circuit but their use is exemplary only and comparable circuits may be constructed using PMOS transistors (p-channel metal-oxide semiconductor field-effect transistors), BJTs (Bipolar junction transistors, typically Silicon based) or other active solid state devices within the scope of the invention.

Major components of IC 200 may be two amplifiers 200A, 200B supplying two output signals. In this exemplary embodiment, two subsystem impedance matching networks 200P, 200Q may also be identified. The two amplifier output signals may be supplied to the two matching networks to produce two further outputs respectively and that are summed at a summing node 200N to produce a summed signal at output port 280 the two matching networks 200P, 200Q may be resonant at an operating frequency of the circuit.

In IC 200, NMOS transistors 201, 202 are active devices that function to amplify an input signal, typically an RF or IF (intermediate frequency) signal, presented at an input signal terminal 250. The circuit may be energized via a power supply rail 215 and a ground 216 in the usual manner.

The input signal may be coupled via DC blocking capacitors 263 to control terminals of transistors 201, 202. The DC bias of each transistor 201, 202 may be set independently by 0 Hz bias voltages introduced at Bias ports 261 and 262. Each transistor 201, 202 may have its own bias voltage independent of the other transistor. Optional inductors 266, 267 may serve as chokes to prevent stray RF voltages entering through the bias ports 261, 262.

The two transistors 201, 202 operate essentially in parallel and their outputs at their respective current terminal circuit nodes 203, 204 may be coupled by capacitors 220 to output port 280. Inductor 230 may function with capacitors 220 as a high-pass filter which may also operate to perform impedance transformation. An output load 290, such as a 50-Ohm radiating antenna, may be coupled to output port 280, but such load is typically not within IC 200.

Inductors 210 are circuit elements within IC 200 whose functions are described below in the discussion of equivalent circuits.

The IC 200 of FIG. 1 may be usefully operated in at least two modes:

In a first mode transistors 201 and 202 may be biased in an active or fully-on region.

In a second mode transistor 202 may be biased in an active or fully-on region and transistor 201 may be cut off, or vice versa.

In other possible intermediate modes, transistors 201 and/or 202 may be operated so as to be partially cut off by reducing their idle or quiescent current.

In the first mode transistors 201 and 202 act in parallel and both amplify the input signal to produce an output signal at the output signal port 280. In the second mode transistor 202 alone amplifies the input signal and circuit node 203 is effectively open circuit to RF signals and thus effectively disconnected from an active device (i.e. transistor 201). In the second mode the overall gain and the maximum output power of the RF PA is less than in the first mode.

Indeed if the two transistors 201 and 202 are identical and the associated components are also identical then the two transistors will contribute equally to the amplified output when the bias voltages are equal thus placing the circuit in the first mode. Thus, the two arms of the circuit are essentially equal or symmetrical when operated in the first mode.

Figure 2:
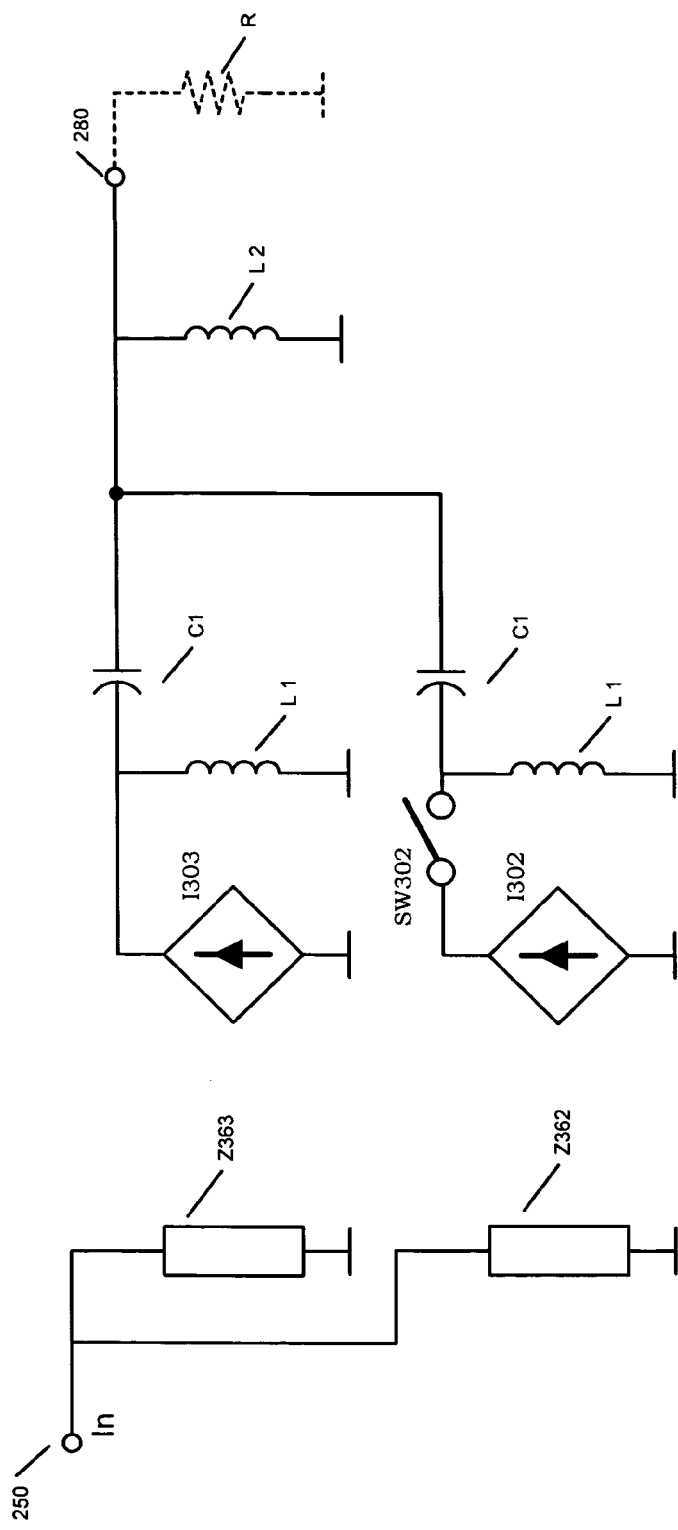
FIG. 2 depicts a small signal equivalent circuit of an RF PA embodied in FIG. 1.

FIG. 2 depicts a "Small Signal" equivalent circuit of the RF PA embodied as IC 200 in FIG. 1 operating in either the first mode (with conceptual switch SW302 closed) or in the second mode (with conceptual switch SW302 open.). Referring to FIG. 2 input port 250 is shown connected to equivalent input impedances Z362 and Z363. Voltage-dependent current source I302 may have a mutual transconductance $g_M$ representing the amplifying properties of corresponding transistor 201 (of FIG. 1).

Similarly, voltage-dependent current source I303 may have the same mutual transconductance $g_M$ and represent the amplifying properties of transistor 202. Inductances L1 represent the properties of inductors 210 of FIG. 1, capacitances C1 represent the properties of capacitors 220 of FIG. 1 and inductance L2 represents the property of inductor 230 FIG. 1. Output port 280 and a resistive load R are also shown.

In accordance with embodiments of the invention, the component parameters of the circuit must be chosen such that the impedance seen by voltage dependent current source I303 does not vary greatly between the two operating modes, or in any intermediate mode. This condition is fulfilled when, at the operating frequency . . .

2C1 is resonant with L2 (or, equivalently C1 is resonant with 2L2) at $\omega_o$, and $\omega_o$ L1<<1/$\omega_o$ C1 . . . where $\omega_o$ is the center operating angular frequency.

The circuit design constraint upon inductance L1 is that of being able to supply a sufficient DC component so that the transistor associated with active voltage-controlled current source 1303 can operate with sufficient headroom. The primary design constraint on C1 is that the combination C1 and 2L2 are substantially resonant at the operating frequency. Therefore it is feasible to choose to implement RF PA 200 with a sufficiently large value for C1 and a sufficiently small value for L1 so that this approximation holds. It may be noted that in much of the prior art the value chosen for components fulfilling a similar role to that of L1 are often too large for this approximation to apply to those circuits. C1 must be embodied with a sufficiently small value that the resonant 2L2 has a sufficiently large value to enable it to be embodied reliably and economically. The upper and lower constraints on C1 may both be implemented with available semiconductor technologies. Certain embodiments of the invention may be possible even when the approximation ωo L1<<1/ωo C1 does not hold, provided always that coo L1<1/ωo C1.

Inevitably, in the design of FIGS. 1 and 2 the value selected for L1 will be a compromise. This is because too large a value will fail to hold the impedance seen by 1303 sufficiently constant and too small a value will result in the impedance being too low for adequate headroom in regards to DC operating conditions and bias.

Moreover, still referring to FIG. 2, a very small value for L1 is impractical because it would fail to allow the impedance seen by I303 to increase when the circuit is in the low power mode. Conversely, a large value is impractical since it would not permit a practical C1 to resonate with 2L2 at the operating frequency.

Figure 3:
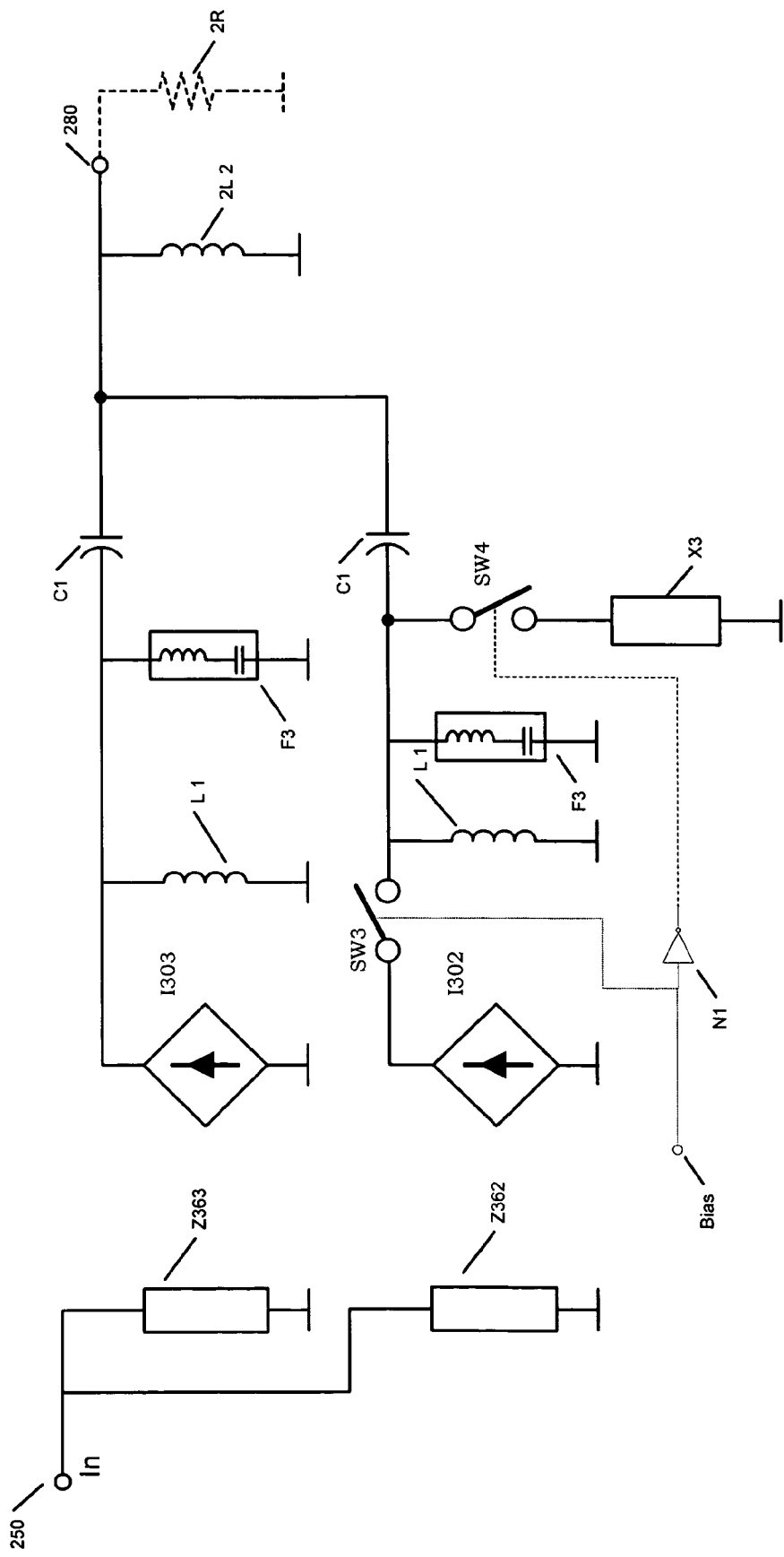
FIG. 3 depicts a small signal equivalent circuit of an RF PA according to an embodiment of the present invention.

FIG. 3 depicts a "Small Signal" equivalent circuit of a RF PA according to an embodiment of the present invention. As compared with the previous figures, the small signal equivalent circuit of FIG. 3 represents a circuit that incorporates further refinements as described below.

Referring to FIG. 3, filters F3 may be harmonic traps and, in a preferred embodiment of the invention, may be second harmonic traps. Such second harmonic traps will serve to shunt undesired signal around the second harmonic of the normal operating frequency but will be reactive-leading (i.e. capacitive) at the fundamental center operating frequency. This may tend to change the value of inductive component(s) required for resonance.

Still referring to FIG. 3, in an embodiment of the invention, switch SW4 acts with compensating impedance X3 to provide a second refinement. In a preferred embodiment of the invention, X3 may be substantially pure inductance and switch SW4 may be embodied as a pHEMT (pseudomorphic High Electron Mobility Transistor) or MOS (Metal-Oxide semiconductor), or even BJT (Bipolar Junction Transistor) or HBT (Heterojunction Bipolar Transistor) sharing a common substrate with the amplifier transistors.

Still referring to FIG. 3, as before, the conceptual switch SW3 represents the ability to bias one of the two parallel amplifier component circuits to cut off. The other conceptual switch SW4 is arranged so that SW4 is open circuit when SW3 is closed circuit and vice versa. This circuit arrangement is indicted by conceptual inverter N1 controlled by signal Bias. Thus, compensating impedance X3 is added as a load to the first amplifier (equivalent current source 1303) whenever the second amplifier (equivalent current source I302) is biased towards cut off.

Compensating impedance X3 may be chosen to raise the impedance seen by the first amplifier whenever the second amplifier is biased towards cut off. This potentially provides at least two advantages over previous amplifier circuits as follows.

In one aspect, increasing the output impedance seen at the first component amplifier whenever the second component amplifier is biased towards cut off acts to increase the energy efficiency of the circuit as a whole when operating at reduced power output levels.

In another aspect, boosting the output impedance seen at the first component amplifier whenever the second component amplifier is biased towards cut off acts to increase the gain of the first stage. In particular, in configurations where there is an attempt to use multiple (or even continuous adjustment of) output levels this permits a smoother transition from low to high power levels and a less critical setting for at least one input bias voltage.

Figure 4:
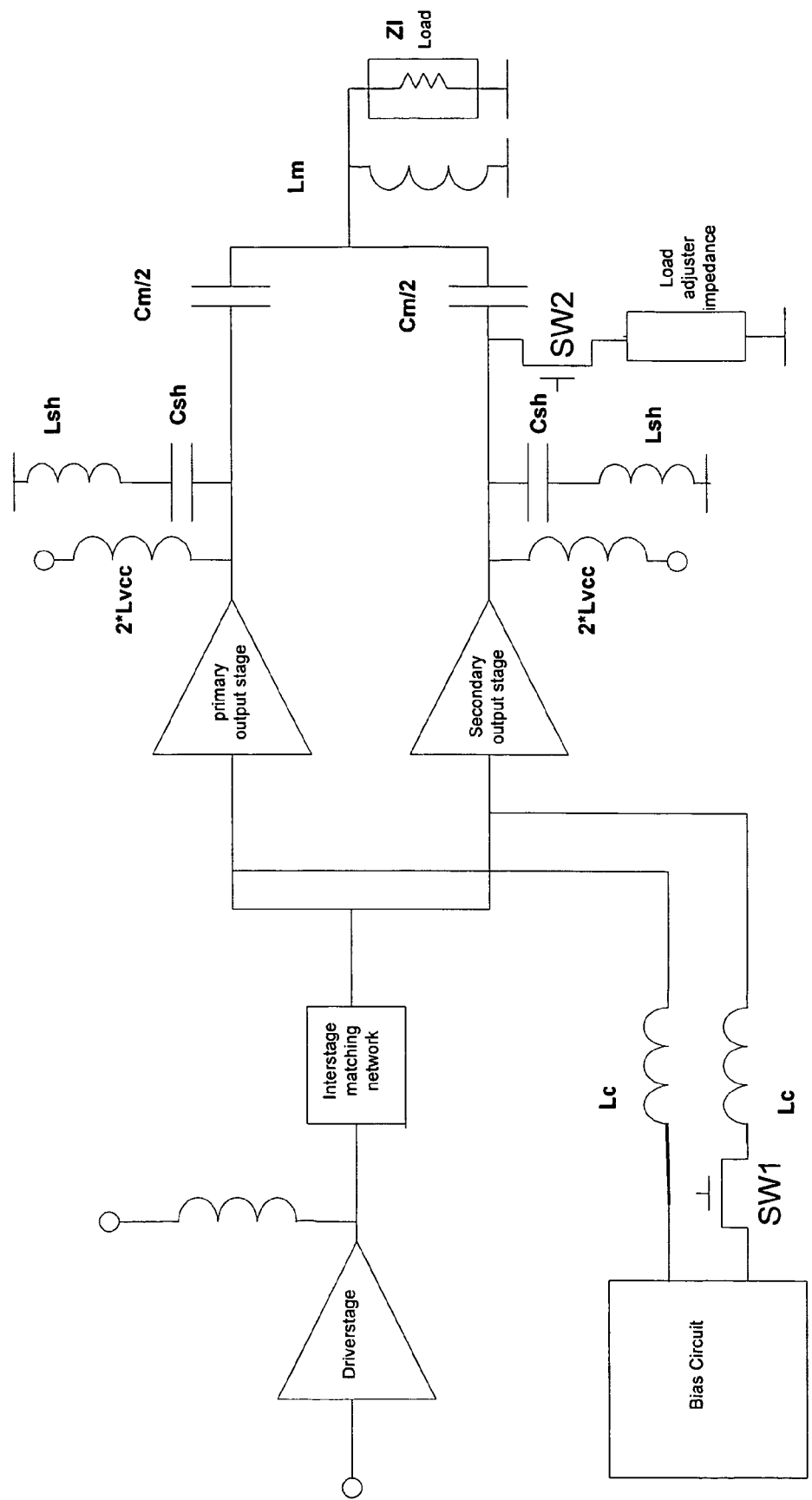
FIG. 4 shows a circuit schematic for an embodiment of the invention.

FIG. 4 shows a circuit for an embodiment of the invention that includes a number of salient features as follows: The exemplary IC of FIG. 4 uses amplifiers (shown as primary and secondary output stage) embodied as any of various types of semiconductor device. The exemplary bias circuit shown provides for a two-mode adjustable gain using a switch SW1. The compensating impedance may be embodied as an inductor ("load adjuster impedance"). The switch SW2 for the compensation reactance (Load adjuster impedance) may be embodied on the same substrate as the amplifier transistors. Or, alternatively, SW2 could, for example, be a discrete switch.

Matching components 2*Lvcc, Csh, Lsh, Cm/2 and Lm perform in a similar manner to the matching components of the previously described circuits, supra. Output load Z1 is conventional. Driver stage, inter stage matching network and bias chokes Lc are all provided as shown.

Although an embodiment of FIG. 4 may use identical primary and secondary output stages that is not a critical feature. In a more general case non-identical output stages may be used, and indeed the passive matching networks may also be embodied with asymmetrical arrangements. In a more general case one may actually have more than two output stages with non-identical matching stages.

Actual component values for optimal quantitative compensation may be determined by circuit simulation techniques which are well known in the art. Various suitable circuit simulation software packages are commonplace in the art; for example, HSPICE™ may be used.

Figure 5:
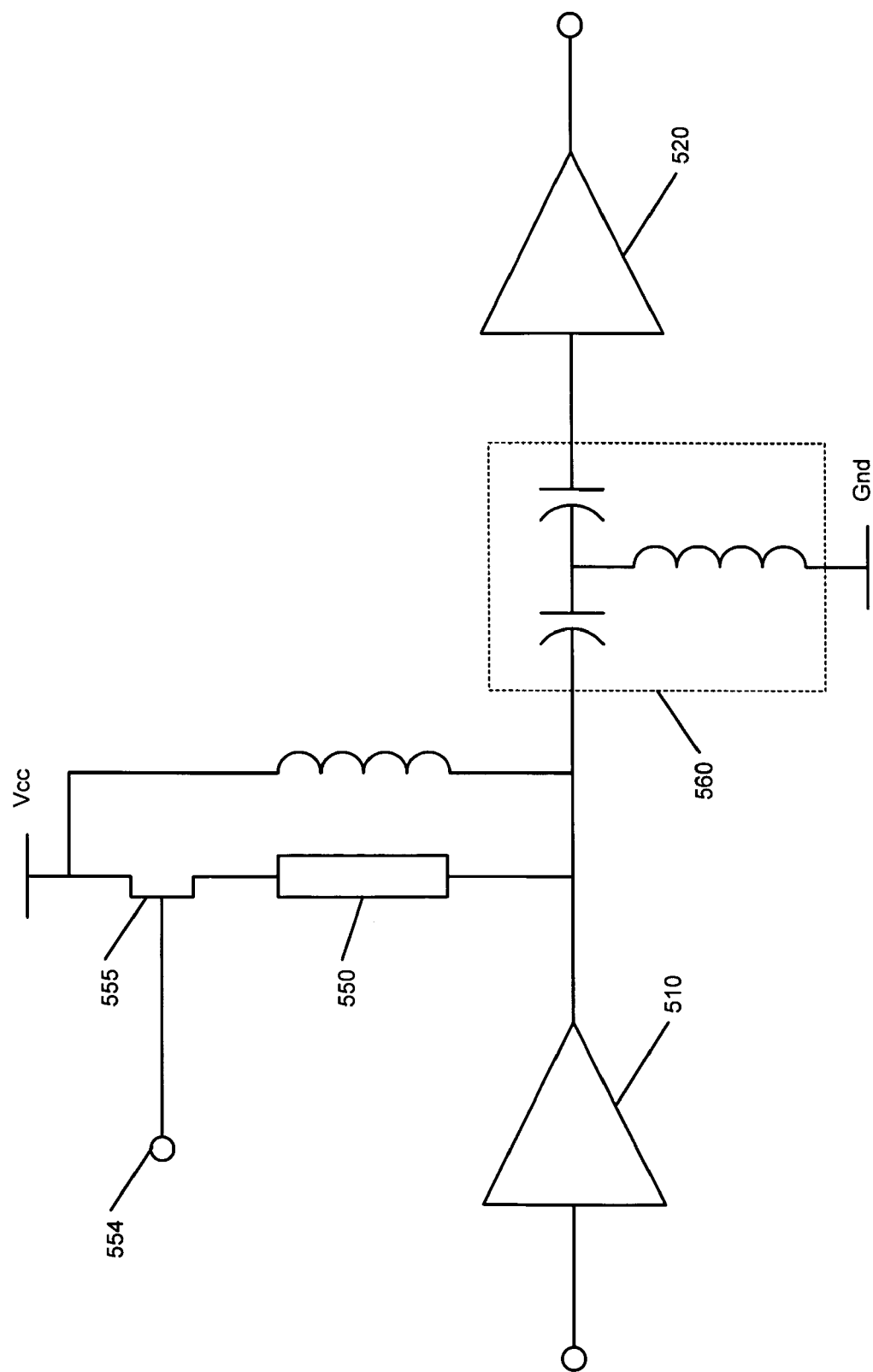
FIG. 5 shows an amplifier circuit in partial block diagram form using two amplifier circuits in cascade either or both amplifiers may embody earlier described aspects of the invention together with further refinements thus to provide a further aspect of the invention For convenience in description, identical components may have been given the same reference numbers in the various drawings.

FIG. 5 shows an amplifier circuit in partial block diagram form using two amplifier circuits in cascade either or both amplifiers may embody earlier described aspects of the invention together with further refinements thus to provide a further aspect of the invention. Again the emphasis is on the provision of at least two modes of amplifier operation that are optimized for energy efficiency at two or more different power levels rather than at differing overall gains. Indeed, in some implementations it may very well be desirable to have as near as possible identical gains in the two modes with the output power level being set by the level of input signal. For battery operated equipment, such as mobile telephone handsets this may reflect a relentless pursuit of maximized battery life. In other implementations it might be desirable to have a small gain difference between high power and low power modes, perhaps very approximately 1 dB in one exemplary embodiment.

In FIG. 5, a first amplifier 510 driver stage is cascaded with a second amplifier 520 output stage. An inter stage matching circuit 560 is provided. Inter stage matching circuits may be embodied in many ways, as is well-known in the art, the "pi" circuit shown is exemplary only. A load compensating impedance 550 may be effectively placed in small signal circuit by turning on switch 555 using a control signal impressed at a control port 554 responsive to whether or not the amplifiers are configured to operate in high power mode. The power supply rail Vcc and ground rail Gnd each provide a small signal ground. Typically, though not necessarily, second amplifier 520 may be embodied according to other embodiments of the invention such as the equivalent circuit of FIG. 3. Load impedance 550 may be resistive or complex or reactive such as inductive. The use of the switched load impedance may act to improve the performance of amplifier 510 by changing the output impedance seen by that amplifier in one or both power modes, and may also improve the inter stage match.

Embodiments of the invention as described herein have significant advantages over previously developed, implementations especially as to energy efficiency and energy management. As will be apparent to one of ordinary skill in the art, still further similar circuit arrangements are possible within the general scope of the invention.

For example p-channel devices and n-channel devices may be interchanged with appropriate source-drain and polarity transpositions as is well known in the art. Further examples may include circuits embodied using discrete transistors or as integrated circuits, using metal-oxide semiconductors or other field effect transistors, and/or with Gallium Arsenide transistors or other technologies.

Also it is possible to replace analog circuit components with digital functional equivalents within the general scope of the invention. The embodiments described above are exemplary rather than limiting and the bounds of the invention should be determined from the claims.

Although preferred embodiments of the present invention have been described in detail hereinabove, it should be understood that many variations and/or modifications of the basic inventive concepts herein taught which may appear to those skilled in the present art will still fall within the spirit and scope of the present invention, as defined in the appended claims.

What is claimed is:

1. A method for amplifying comprising:
   operating a first amplifier comprising a first active device supplying a first signal to a first matching network, the first matching network producing a first output, the first matching network including a first set of devices having a first resonance at a normal operating frequency of the circuit; and
   operating a second amplifier comprising a second active device supplying a second signal to a second matching network, the second matching network producing a second output, the second matching network including a second set of devices having a second resonance at the normal operating frequency of the circuit;
   wherein the respective outputs of the first and second amplifiers are summed at a summing node to produce a summed signal and,
   wherein a circuit output signal is derived from tho summed signal and,
   wherein the method has at least a first operating mode and a second operating mode and,
   wherein whenever the method is utilizing the second operating mode:

the second active device is cut off and at least one of the first and second matching networks is loaded by a compensating impedance circuit; and wherein whenever the method is utilizing the first operating mode:

the first and second active devices are biased to be active and turned on and neither of the first and second matching networks is loaded by the compensating impedance circuit, whereby the circuit operates with high efficiency and higher power in the first operating mode and the circuit operates with high efficiency and lower power in the second operating mode.

2. The method of claim 1 wherein:

the compensating impedance circuit is controlled by a switch and further wherein the first and second amplifiers and the switch are formed on a common semiconductor substrate.

3. The method of claim 1 wherein:

the first and second matching networks include a respective second harmonic trap.

4. The method of claim 1 wherein:

the overall circuit gain when operating in the first mode is substantially equal to the overall circuit gain when operating in the second mode.

5. The method of claim 1 wherein:

the first and second amplifiers are implemented using devices selected from a list consisting of metal oxide semiconductor transistors, silicon bipolar transistors, Gallium Arsenide transistors, Indium Phosphate transistors and III–IV semiconductor devices.

6. The method of claim 1 wherein:

the first and second amplifiers are implemented using HBT devices.

7. The method of claim 1 wherein:

the first and second amplifiers are implemented using CMOS devices.

8. The method of claim 1 wherein:

the first and second amplifiers are implemented using SiGe devices.

9. A circuit for amplifying comprising:

a first amplifier comprising a first active device supplying a first signal to a first matching network, the first matching network producing a first output, the first matching network including a first set of devices having a first resonance at a normal operating frequency of the circuit; and a second amplifier comprising a second active device supplying a second signal to a second matching network, the second matching network producing a second output, the second matching network including a second set of devices having a second resonance at the normal operating frequency of the circuit;

wherein the respective outputs of the first and second amplifiers are summed at a summing node to produce a summed signal and, wherein a circuit output signal is derived from the summed signal and, wherein the circuit has at least a first operating mode and a second operating mode and, wherein whenever the circuit is utilizing the second operating mode:

the second active device is cut off and at least one of the first and second matching networks is loaded by a compensating impedance circuit; and wherein whenever the circuit is utilizing the first operating mode:

the first and second active devices are biased to be active and turned on and neither of the first and second matching networks is loaded by the compensating impedance circuit, whereby the circuit operates with high efficiency and higher power in the first operating mode and the circuit operates with high efficiency and lower power in the second operating mode.

10. The circuit of claim 9 wherein:

the compensating impedance circuit is controlled by a switch and further wherein the first and second amplifiers and the switch are formed on a common semiconductor substrate.

11. The circuit of claim 9 where in:

the first and second matching networks include a respective second harmonic trap.

12. The circuit of claim 9 wherein:

the overall circuit gain when operating in the first mode is substantially equal to the overall circuit gain when operating in the second mode.

13. The circuit of claim 9 wherein:

the first and second amplifiers are implemented using devices selected from a list consisting of metal-oxide semiconductor transistors, silicon bipolar transistors, Gallium Arsenide transistors, Indium Phosphate transistors, III–IV semiconductor, and SiGe devices.

14. The circuit of claim 9 wherein:

the first and second amplifiers are implemented using HBT devices.

15. A circuit for amplifying comprising:

a first amplifier having a high power mode of operation and a low power mode of operation:

a second amplifier connected in cascade with the first amplifier and an inter stage matching circuit connected between first and second amplifiers, the inter stage matching circuit comprising:

a compensating load and a switch operable to place the compensating load in small signal circuit between a node of the inter stage matching circuit and a small signal ground responsive to a selection of a power mode of operation of the first amplifier selected from the high power mode and the low power mode wherein:

the overall circuit gain when operating in the high power mode is substanially equal to the overall circuit gain when operating in the low power mode.

16. The circuit of claim 15 wherein:

the first and second amplifiers are implemented using devices selected from a list consisting of metal-oxide semiconductor transistors, silicon bipolar transistors, Gallium Arsenide transistors, Indium Phosphate transistors, and III–IV semiconductor devices.

17. The circuit of claim 15 wherein:

the first and second amplifiers are implemented using HBT devices.

18. The circuit of claim 15 wherein:

the first and second amplifiers are implemented using CMOS devices.

19. The circuit of claim 15 wherein;

the first and second amplifiers are implemented using SiGe devices.

* * * * *